(12) United States Patent
Iwamuro

(10) Patent No.: US 8,390,027 B2
(45) Date of Patent: Mar. 5, 2013

(54) GALLIUM NITRIDE SEMICONDUCTOR DEVICE AND MANUFACTURING METHOD THEREOF

(75) Inventor: Noriyuki Iwamuro, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 771 days.

(21) Appl. No.: 12/243,201

(22) Filed: Oct. 1, 2008

(65) Prior Publication Data

US 2009/0085166 A1 Apr. 2, 2009

(30) Foreign Application Priority Data

Oct. 1, 2007 (JP) ................................. 2007-257398

(51) Int. Cl.
*H01L 29/20* (2006.01)
*H01L 21/20* (2006.01)

(52) U.S. Cl. .......... 257/190; 257/183; 257/192; 438/47; 438/94; 438/172; 438/191; 438/235; 438/312

(58) Field of Classification Search .................. 257/192, 257/E29.089
See application file for complete search history.

(56) References Cited

U.S. PATENT DOCUMENTS

| | | | | |
|---|---|---|---|---|
| 5,236,854 | A * | 8/1993 | Higaki | 438/167 |
| 6,410,944 | B1 * | 6/2002 | Song | 257/99 |
| 6,432,788 | B1 * | 8/2002 | Maruska et al. | 438/328 |
| 6,693,024 | B2 * | 2/2004 | Lehmann et al. | 438/542 |
| 6,984,536 | B2 * | 1/2006 | Manabe et al. | 438/22 |
| 7,259,409 | B2 | 8/2007 | Koinuma et al. | |
| 7,361,946 | B2 * | 4/2008 | Johnson et al. | 257/253 |
| 7,566,913 | B2 * | 7/2009 | Therrien et al. | 257/103 |
| 7,713,794 | B2 * | 5/2010 | Iwamuro | 438/140 |
| 7,781,894 | B2 * | 8/2010 | Oikawa | 257/774 |
| 7,816,764 | B2 * | 10/2010 | Marchand et al. | 257/613 |
| 2002/0060326 | A1 * | 5/2002 | Manabe et al. | 257/103 |
| 2004/0061163 | A1 * | 4/2004 | Nakayama | 257/302 |
| 2004/0070013 | A1 * | 4/2004 | Yamaguchi et al. | 257/288 |

(Continued)

FOREIGN PATENT DOCUMENTS

| | | |
|---|---|---|
| JP | 11-354786 A | 12/1999 |
| JP | 2004-111883 A | 4/2004 |

(Continued)

OTHER PUBLICATIONS

Japanese Office Action cited in corresponding Japanese Application No. JP2007-257398, dated Jun. 12, 2012. Partial English translation provided.

*Primary Examiner* — Wai Sing Louie
*Assistant Examiner* — William Harriston
(74) *Attorney, Agent, or Firm* — Rossi, Kimms & McDowell LLP

(57) ABSTRACT

A gallium nitride semiconductor device is disclosed that can be made by an easy manufacturing method. The device includes a silicon substrate, buffer layers formed on the top surface of the silicon substrate, and gallium nitride grown layers formed thereon. The silicon substrate has trenches 12 formed from the bottom surface, each trench having a depth reaching the gallium nitride grown layer through the silicon substrate and the buffer layers. The inside surface of each of the trenches and the bottom surface of the silicon substrate is covered with a drain electrode as a metal film. The vertical gallium nitride semiconductor device with this structure allows an electric current to flow in the direction of the thickness of the silicon substrate regardless of the resistance values of the gallium nitride grown layers and the buffer layers.

5 Claims, 10 Drawing Sheets

U.S. PATENT DOCUMENTS

| | | | |
|---|---|---|---|
| 2004/0082116 A1* | 4/2004 | Kub et al. | 438/137 |
| 2004/0150001 A1* | 8/2004 | Shchukin et al. | 257/183 |
| 2005/0087763 A1* | 4/2005 | Kanda et al. | 257/192 |
| 2006/0057768 A1* | 3/2006 | Nakanishi et al. | 438/106 |
| 2007/0051977 A1* | 3/2007 | Saito et al. | 257/192 |
| 2007/0096081 A1* | 5/2007 | Sugawara | 257/40 |
| 2007/0111456 A1* | 5/2007 | Ji et al. | 438/291 |
| 2007/0117360 A1* | 5/2007 | Blanchard | 438/510 |
| 2007/0120265 A1* | 5/2007 | Fukumi et al. | 257/773 |
| 2007/0132017 A1* | 6/2007 | Oikawa | 257/330 |
| 2007/0221944 A1* | 9/2007 | Cheol Yoo | 257/99 |
| 2008/0142837 A1 | 6/2008 | Sato et al. | |
| 2009/0065785 A1* | 3/2009 | Beach | 257/76 |
| 2009/0283776 A1* | 11/2009 | Iwamuro | 257/76 |

FOREIGN PATENT DOCUMENTS

| | | |
|---|---|---|
| JP | 2006-156658 A | 6/2006 |
| JP | 2007-208037 A | 8/2007 |
| JP | 2008-118082 A | 5/2008 |
| JP | 2008-124217 A | 5/2008 |

* cited by examiner

GALLIUM NITRIDE SEMICONDUCTOR DEVICE AND MANUFACTURING METHOD THEREOF

BACKGROUND OF THE INVENTION

A. Field of the Invention

The present invention relates to a vertical semiconductor device using gallium nitride semiconductor and a manufacturing method thereof.

B. Description of the Related Art

A silicon single crystal has been previously used for the material for a power semiconductor device that controls a high breakdown voltage and a large electric current. There are many kinds of power semiconductor devices which are manufactured. They have their respective advantages and disadvantages, so that currently they are separately used according to the purpose of the usage. For example, devices such as a bipolar transistor or an IGBT (Insulated Gate Bipolar Transistor) can be operated with large current densities, but there are limitations in their high speed switching operations. Their limiting switching frequencies are said to be several kilohertz in bipolar transistors and 20 kHz to 30 kHz in IGBTs. While devices such as power MOSFETs and Schottky barrier diodes can not be operated with a large current, they can be operated at higher speed up to higher frequency regions of several megahertz. In the market for power semiconductor devices, however, there is a strong requirement for a power device that can be operated with a large current at a high speed. Therefore, for devices such as IGBTs and power MOSFETs, efforts have been concentrated particularly on improvement in their switching speeds. As a result, it is said that their switching speeds have reached those close to the limits for materials being used as explained in the foregoing. Nevertheless, the switching speeds have not reached required levels.

A gallium nitride (GaN) semiconductor has an energy gap as high as 3 eV or more, with which development of photonic devices such as blue LEDs (Light Emitting Diodes) and blue LDs (Laser Diodes) have been implemented previously. However, a gallium nitride (GaN) semiconductor has features that its breakdown voltage is high and its maximum allowable electric field strength is also one order higher than that of silicon. This enables GaN to be the material for a power device having low on-resistance and used for high speed switching. Therefore, in the last few years, research and development for applying GaN to such a power device have been actively pursued. A switching device using gallium nitride (GaN) as its material has been generally known up to now as a HEMT (High Electron Mobility Transistor) device in which GaN is grown on a sapphire substrate. The HEMT device, having a characteristic of high electron mobility, is characterized in that on-resistance becomes significantly low. The device uses a sapphire substrate as an insulator, and all of the electrodes for taking out electric current must be provided on the top surface side of the GaN layer. Therefore, the HEMT device inevitably has a lateral device structure (JP-A-2004-31896, corresponding to U.S. Pat. No. 6,768,146).

As was explained in the foregoing, an HEMT device, having a lateral device structure, can be made to be resistant to a high breakdown voltage. However, because of the structure electric current flows only in the vicinity of the surface of the device. This is liable to cause a non-uniform current distribution and liable to increase the wiring resistance of the surface electrode of the device. For these reasons, it is difficult to make a device with a large current capacity. Therefore, a semiconductor device with the above explained structure in which a gallium nitride (GaN) layer is grown on a sapphire substrate is unsuitable for a vertical device having a structure in which electrodes for taking out current are respectively provided on the top surface and the bottom surface of the device so that a uniform current easily flows longitudinally (in the direction of the thickness) in the device. Nevertheless, a study of a vertical HEMT device using no sapphire substrate has also been performed, in which device a GaN layer is epitaxially grown on a gallium nitride (GaN) substrate and a HEMT structure is formed in the GaN layer, for example (Masakazu Kanechika et al., "A Vertical Operation of Insulated Gate AlGaN/GaN-HFETs," EDD-06-104, Transactions of the Study Meeting, the Institute of Electrical Engineers of Japan, pp. 21-24 (2006)).

The GaN substrate used for the vertical HEMT described in the above document has drawbacks in that it is so expensive and so difficult to enlarge the diameter of its wafer that it is basically unsuitable for mass production using the large diameter wafers necessary for reducing device costs. Thus, many attempts have been made to develop semiconductor devices by using substrates in each of which a GaN layer is epitaxially grown on a silicon substrate that is, in addition to being inexpensive, field proven in enlarging its wafer diameter. Success in these developments will enable production of high performance semiconductor devices having the same mass productivity as that of current silicon power semiconductor devices. At present, however, when a GaN layer is grown directly on a silicon substrate, the difference in lattice constant between a silicon crystal and a GaN crystal causes crystalline defects in the GaN crystal. This induces dislocation in the GaN crystal from the interface between the silicon substrate and the GaN layer. The dislocation causes a considerably large leak current in a turned-off state of the device, which is a fatal problem for an electronic device. In order to counter the problem, a measure is known by which a buffer layer such as an aluminum nitride (AlN) layer is provided between the silicon substrate and the GaN layer to enhance the crystallinity of the GaN layer and avoid the problem of causing the large current leakage (JP-A-2003-60212 and JP-A-5-343741 (corresponding to U.S. Pat. No. 5,239,188)).

Furthermore, a manufacturing method is known in which trenches are formed on a silicon semiconductor substrate beforehand and n⁻ GaN layers are thereafter grown thereon as shown in FIG. 6 as a cross sectional view of a principal part of a silicon semiconductor substrate with GaN layers formed thereon (JP-A-2006-165191). According to the description of JP-A-2006-165191, the GaN layer, being formed on the trench by a lateral selective growth method at GaN crystal growth, can reduce occurrence of dislocation due to difference between the lattice constant of GaN crystal and that of silicon crystal.

Moreover, a semiconductor device using a GaN semiconductor is also known which has a structure with an electrode formed on the exposed bottom of each trench which is provided by selectively removing a portion of a silicon semiconductor substrate in trench-like from the bottom surface thereof (Japanese Patent No. 3634627). In addition, it is known that a metal sulfide thin film provided as a buffer layer between a silicon substrate and a GaN semiconductor layer enables the sulfide layer to be epitaxially grown on the silicon substrate without forming an amorphous layer at the interface between the buffer layer and the silicon substrate (JP-A-2002-3297).

However, because of a considerably wide band gap (6.2 eV) of the AlN layer, the structure of using an AlN layer as a buffer layer causes the resistance of the AlN layer to become high. As a result, when an electric current is made to flow vertically, the resistance of the whole semiconductor layer is determined by the resistance in the AlN layer. Namely, there newly arises a problem of causing an on-voltage to become considerably high.

Moreover, in the manufacturing method described in JP-A-2006-165191, as shown in FIG. 6 as a cross sectional view of the principal part of the silicon semiconductor substrate with GaN layers formed thereon, trenches 6 are already provided on the surface of silicon semiconductor substrate 1 before GaN layer 5 is epitaxially grown on the surface of silicon semiconductor substrate 1. This causes GaN layer 5 to be formed not only on the surface of silicon semiconductor substrate 1, but also on the inner surfaces of trenches 6. However, for silicon semiconductor substrate 1, a wafer with a (111) plane taken as its principal surface is used for matching a lattice constant to that of the GaN layer formed thereon. Thus, the silicon surface of the sidewall in trench 6 becomes no (111) plane. Therefore, GaN layer 5-1 formed on the side wall has many lattice defects which are liable to cause dislocation. Moreover, GaN layer 5-1 on the side wall of trench 6 has a high possibility of remaining in the semiconductor device until the manufacturing process is completed. Hence, the dislocation introduced in GaN layer 5-1 on the sidewall of trench 6 has a possibility of causing a leak current. Furthermore, in a GaN crystal formed by a lateral selective growth method, a so-called grain boundary 11 is liable to appear on an interface at which adjoining laterally grown layers are butted against each other on the surface of the substrate plane. As a result, there is a concern that when metal 7 is buried in the trench in the subsequent process, metal 7 may reach the surface of n⁻ GaN layer 5 through grain boundary 11 to cause a short-circuit fault between electrodes.

The present invention is made in view of the points explained in the foregoing and it is an object of the invention to provide a gallium nitride semiconductor device that can be easily manufactured as a vertical semiconductor device in which an electric current flows in the direction of the thickness of the substrate regardless of resistance values of gallium nitride grown layers and buffer layers, and a manufacturing method of the device.

SUMMARY OF THE INVENTION

According to a first aspect of the invention, a gallium nitride semiconductor device is provided which includes a silicon semiconductor substrate, a buffer layer provided on one of the principal surfaces of the silicon semiconductor substrate for either one or both of crystal structure conversion and crystal quality improvement, and an epitaxial gallium nitride semiconductor layer layered on the buffer layer.

The silicon semiconductor substrate has a plurality of trenches formed on the side of the other principal surface each with a depth reaching the gallium nitride semiconductor layer from the other principal surface through the silicon semiconductor substrate and the buffer layer, and the inside surface of each of the trenches and the other principal surface of the silicon semiconductor substrate are covered with a metal film.

According to a second aspect of the invention, in the gallium nitride semiconductor device according to the first aspect of the invention, the buffer layer further comprises an aluminum nitride layer on the side of the silicon semiconductor substrate and a gallium nitride layer on the upper side thereof.

According to a third aspect of the invention, in the gallium nitride semiconductor device according to the second aspect of the invention, a metal sulfide layer is provided between the buffer layer and the silicon semiconductor substrate.

According to a fourth aspect of the invention, in the gallium nitride semiconductor device according to the second or the third aspect of the invention, the epitaxial gallium nitride semiconductor layer further comprises a gallium nitride semiconductor layer of one conductivity type with a high impurity concentration on the side of the buffer layer and a gallium nitride semiconductor layer of one conductivity type with a low impurity concentration on the upper side thereof.

According to a fifth aspect of the invention, a method of manufacturing a gallium nitride semiconductor device is provided which includes the steps of preparing a silicon semiconductor substrate, forming a buffer layer on one of the principal surfaces of the silicon semiconductor substrate, the buffer layer being formed for either one or both of crystal structure conversion and crystal quality improvement, forming a gallium nitride semiconductor layer on the buffer layer by epitaxial growth, forming a plurality of trenches in the silicon semiconductor substrate on the side of the other principal surface thereof, each trench being formed with a depth reaching the gallium nitride semiconductor layer from the other principal surface through the silicon semiconductor substrate and the buffer layer, and forming a metal film so as to cover the inside surface of each of the trenches and the other principal surface of the silicon semiconductor substrate.

According to a sixth aspect of the invention, in the method of manufacturing a gallium nitride semiconductor device according to the fifth aspect of the invention, the step of forming the buffer layer further includes the steps of forming an aluminum nitride layer on the side of the silicon semiconductor substrate, and forming a gallium nitride layer on the upper side the aluminum nitride layer.

In short, for achieving the object of the invention, the gallium nitride semiconductor device according to the invention includes a silicon substrate, buffer layers formed on the surface of the silicon substrate, and gallium nitride semiconductor layers formed thereon. The silicon substrate has trenches formed from the bottom surface thereof each having the depth reaching the gallium nitride semiconductor layer through the silicon substrate and the buffer layers. The inside surface of each of the trenches and the bottom surface of the silicon substrate is covered with a conductive film. Moreover, the method of manufacturing the gallium nitride semiconductor device according to the invention includes the steps of forming the buffer layers and the gallium nitride semiconductor layers in the order on the surface of the silicon substrate, forming the trenches on the bottom surface of the silicon substrate, and forming the conductive film so as to cover the inside surface of each of the trenches and the bottom surface of the silicon substrate. In the invention, with a MOS gate structure formed on the surface of the gallium nitride semiconductor layer, a MOSFET and the manufacturing method thereof are provided. Moreover, with a Schottky barrier electrode, for example, formed on the gallium nitride semiconductor substrate arranged in the foregoing, a Schottky barrier diode and the manufacturing method thereof are provided. As a result, according to the invention, a gallium nitride semiconductor device is obtained which inhibits an increase in an on-voltage and can be easily manufactured.

According to the invention, it is possible to provide a gallium nitride semiconductor device that can be easily manufactured as a vertical semiconductor device in which an electric current flows in the direction of the thickness of the substrate regardless of resistance values of gallium nitride grown layers and buffer layers, and a manufacturing method of the device.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

In the following, explanations will be made in detail about the gallium nitride semiconductor device according to the invention and the manufacturing method thereof with reference to drawings. The invention is not limited to the descriptions of examples that will be explained below, unless it would depart from the spirit and the scope thereof.

Figure 1:
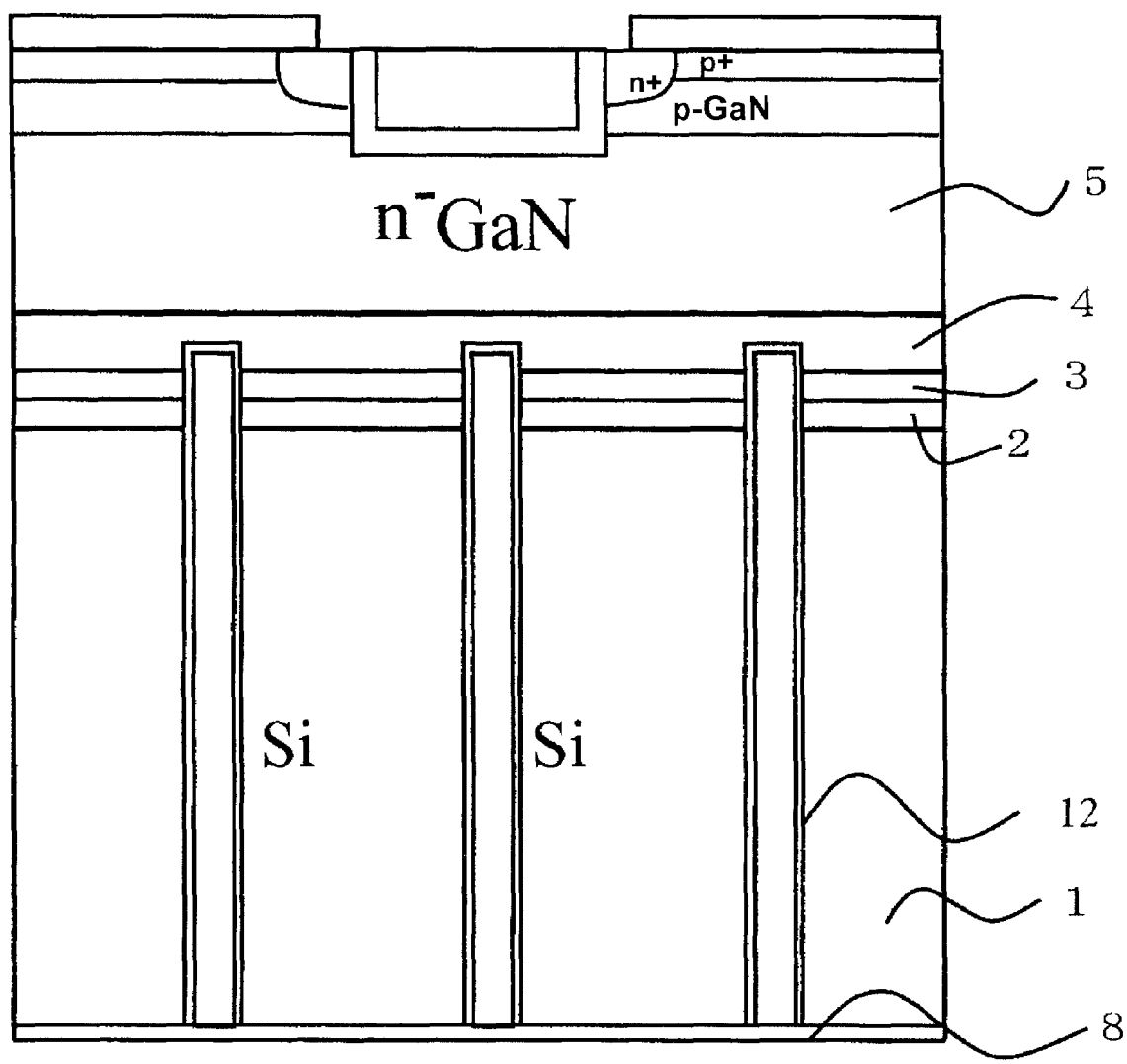
FIG. 1 is a cross sectional view showing the principal part of a GaN-MOSFET according to Example 1 of the invention.
Figure 7:
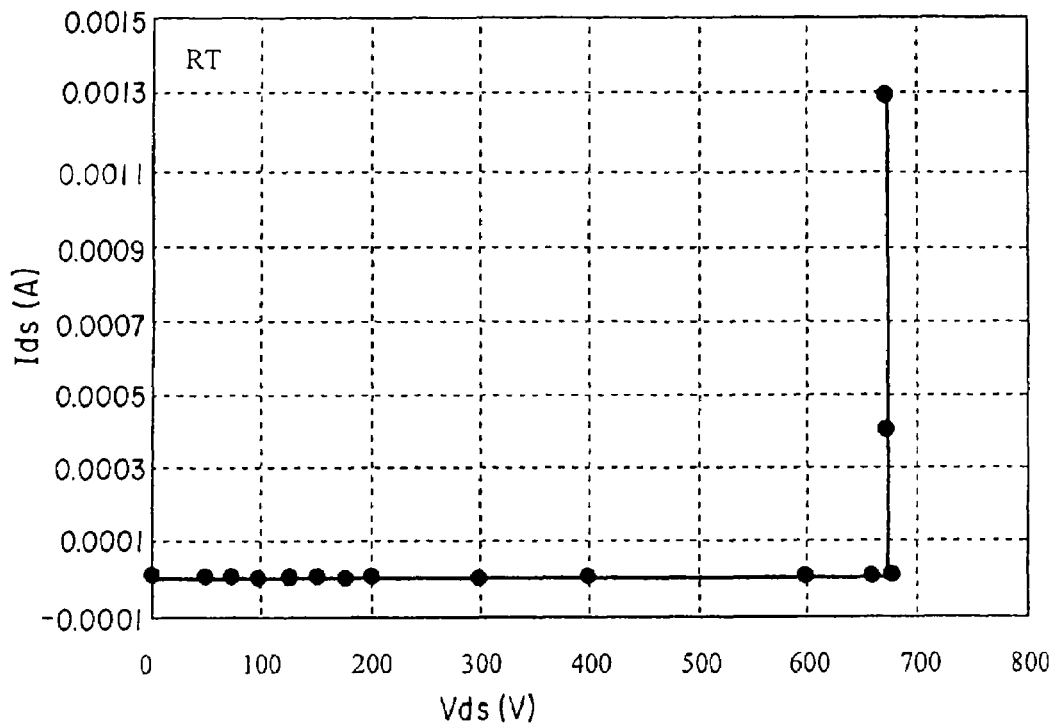
FIG. 7 is a diagram showing the breakdown voltage blocking characteristic at turning-off of the GaN-MOSFET according to Example 1 of the invention.
Figure 8:
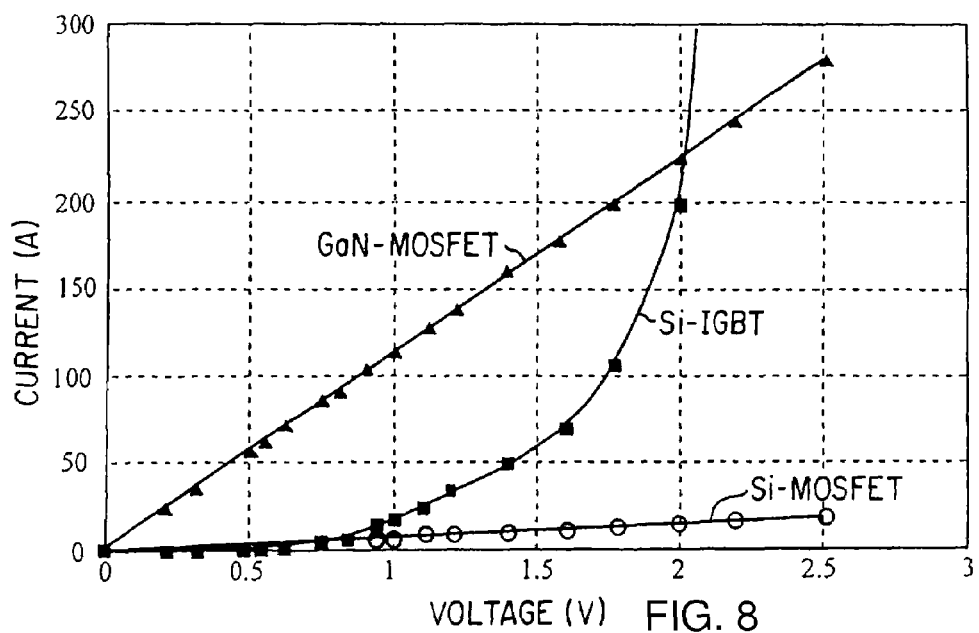
FIG. 8 is a diagram showing the I-V characteristic at turning-on of the GaN-MOSFET according to Example 1 of the invention together with those of an ordinary Si-IGBT and an ordinary Si-MOSFET.
Figure 9:
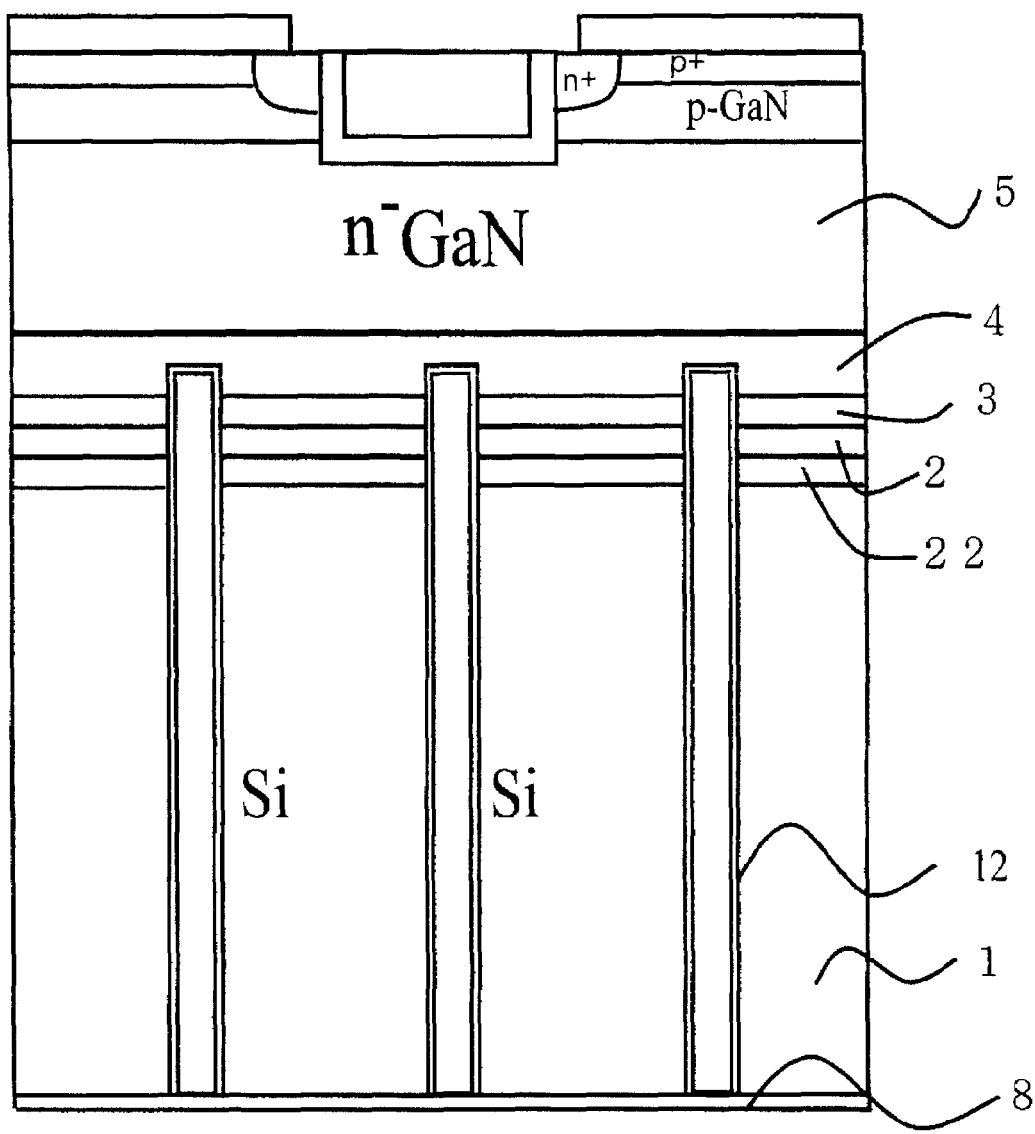
FIG. 9 is a cross sectional view showing the principal part of a GaN-MOSFET according to Example 2 of the invention.
Figure 10:
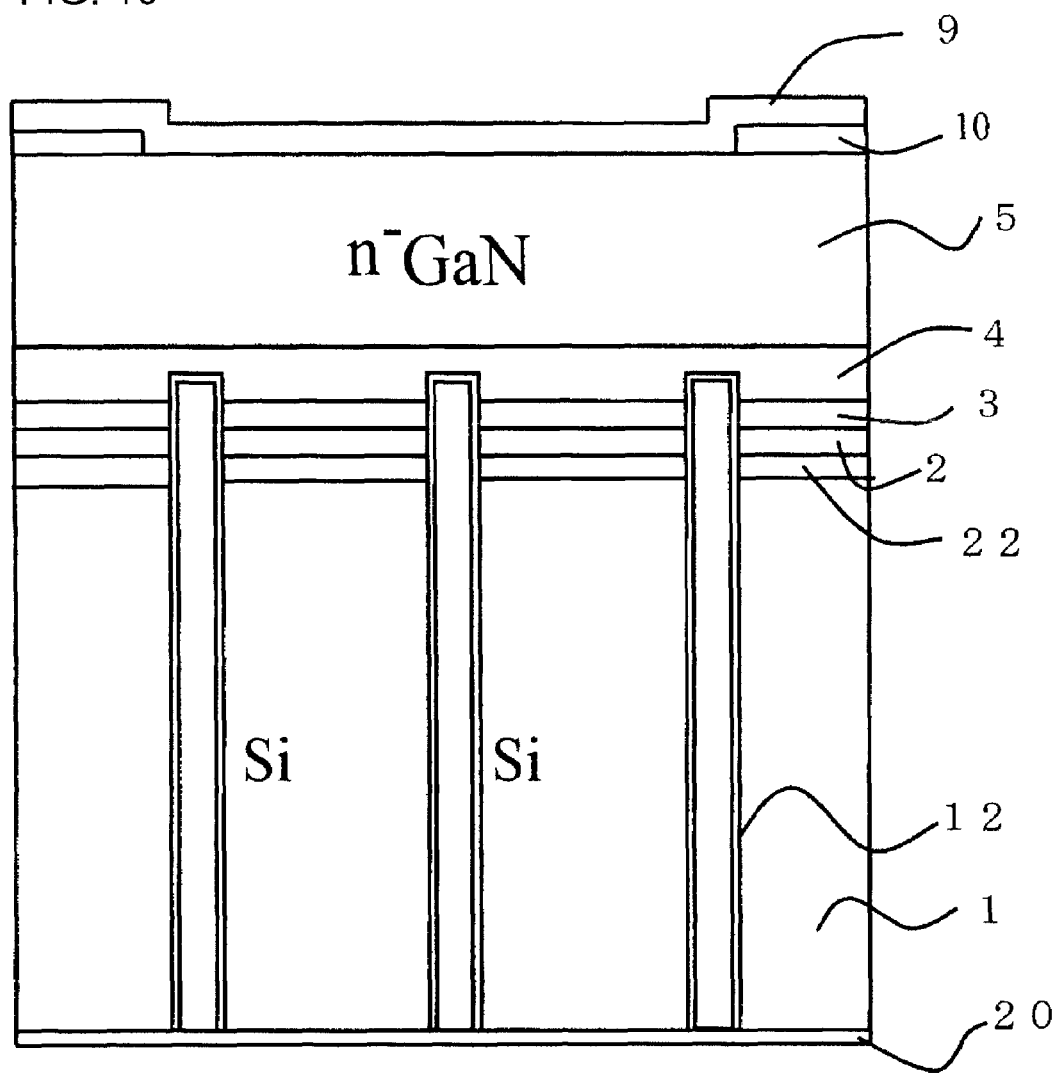
FIG. 10 is a cross sectional view showing the principal part of a GaN Schottky barrier diode according to Example 3 of the invention.
Figure 11:
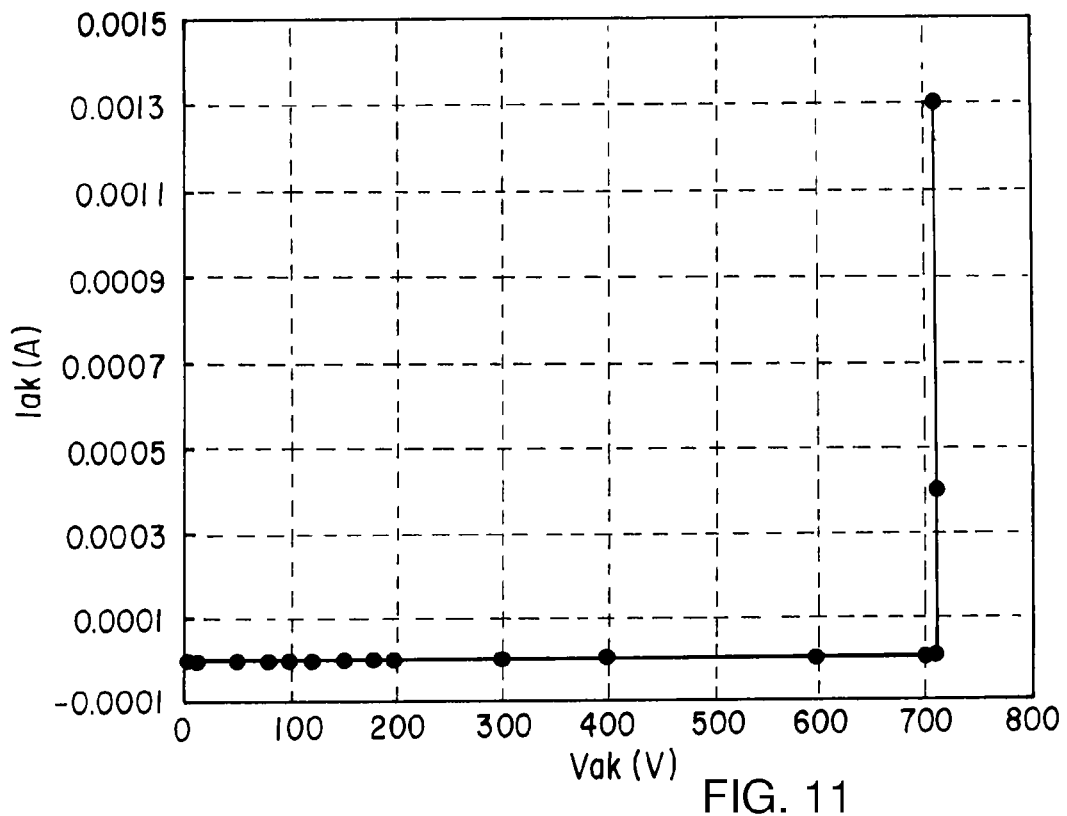
FIG. 11 is a diagram showing the breakdown voltage blocking characteristic of the GaN Schottky barrier diode according to Example 3 of the invention.
Figure 12:
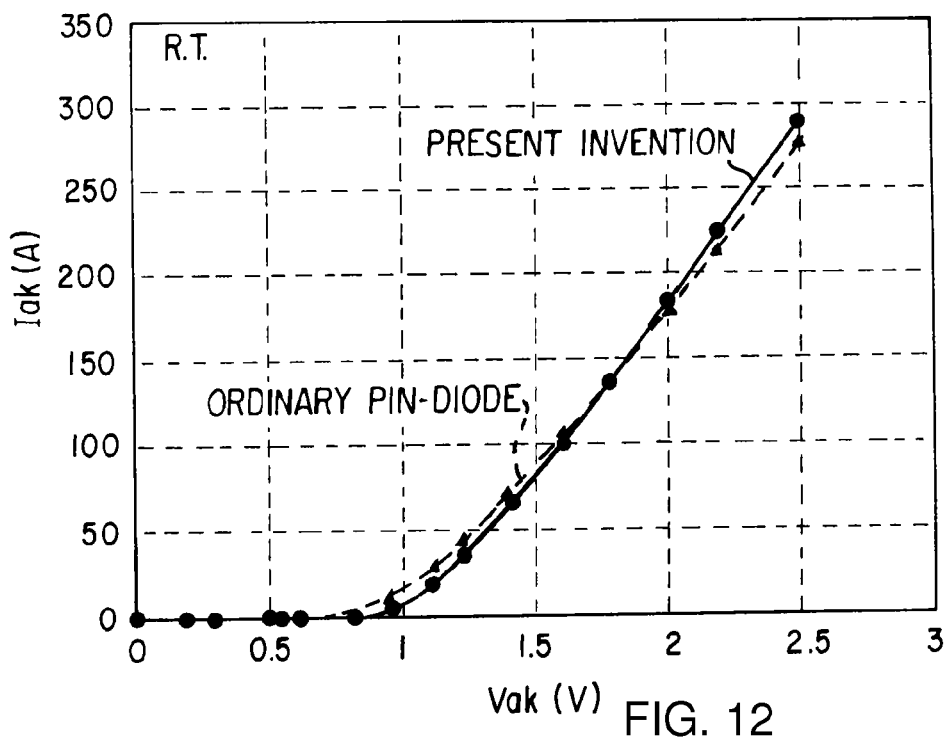
FIG. 12 is a diagram showing the forward I-V characteristic of the GaN Schottky barrier diode according to Example 3 of the invention together with that of an ordinary pin diode.

FIG. 1 is a cross sectional view showing the principal part of a GaN-MOSFET according to Example 1 of the invention. FIGS. 2 to 5 are cross sectional views each showing the principal part of the GaN-MOSFET according to Example 1 of the invention for explaining the manufacturing method of the GaN-MOSFET. FIG. 7 is a diagram showing the breakdown voltage blocking characteristic at turning-off of the GaN-MOSFET according to Example 1 of the invention. FIG. 8 is a diagram showing the I-V characteristic at turning-on of the GaN-MOSFET according to Example 1 of the invention together with those of an ordinary Si-IGBT and an ordinary Si-MOSFET. FIG. 9 is a cross sectional view showing the principal part of a GaN-MOSFET according to Example 2 of the invention. FIG. 10 is a cross sectional view showing the principal part of a GaN Schottky barrier diode according to Example 3 of the invention. FIG. 11 is a diagram showing the breakdown voltage blocking characteristic of the GaN Schottky barrier diode according to Example 3 of the invention. FIG. 12 is a diagram showing the forward I-V characteristic of the GaN Schottky barrier diode according to Example 1 of the invention together with that of an ordinary pin diode.

Example 1

In the following, explanations will be made about Example 1 of the invention with reference to FIG. 1 to FIG. 8. In Example 1, a MOSFET with a breakdown voltage of 600 V was taken as a vertical semiconductor device. FIG. 1 is a cross sectional view showing the principal part of a gallium nitride MOSFET explained as Example 1. As shown in the figures, the gallium nitride MOSFET according to Example 1 has silicon substrate 1, and thin aluminum nitride (AlN) buffer layer 2 and non-doped GaN buffer layer 3 formed on the top surface of silicon substrate 1. On non-doped GaN buffer layer 3, n$^+$ GaN layer 4 with a high impurity concentration and n$^-$ GaN layer 5 with a low impurity concentration are layered in that order. Further, silicon substrate 1 has trenches 12 reaching n$^+$ GaN layer 4 from the bottom surface of substrate 1. The bottom and the side wall of trench 12 and the bottom surface of silicon substrate 1 are covered with a metal film as drain electrode 8.

Figure 2:
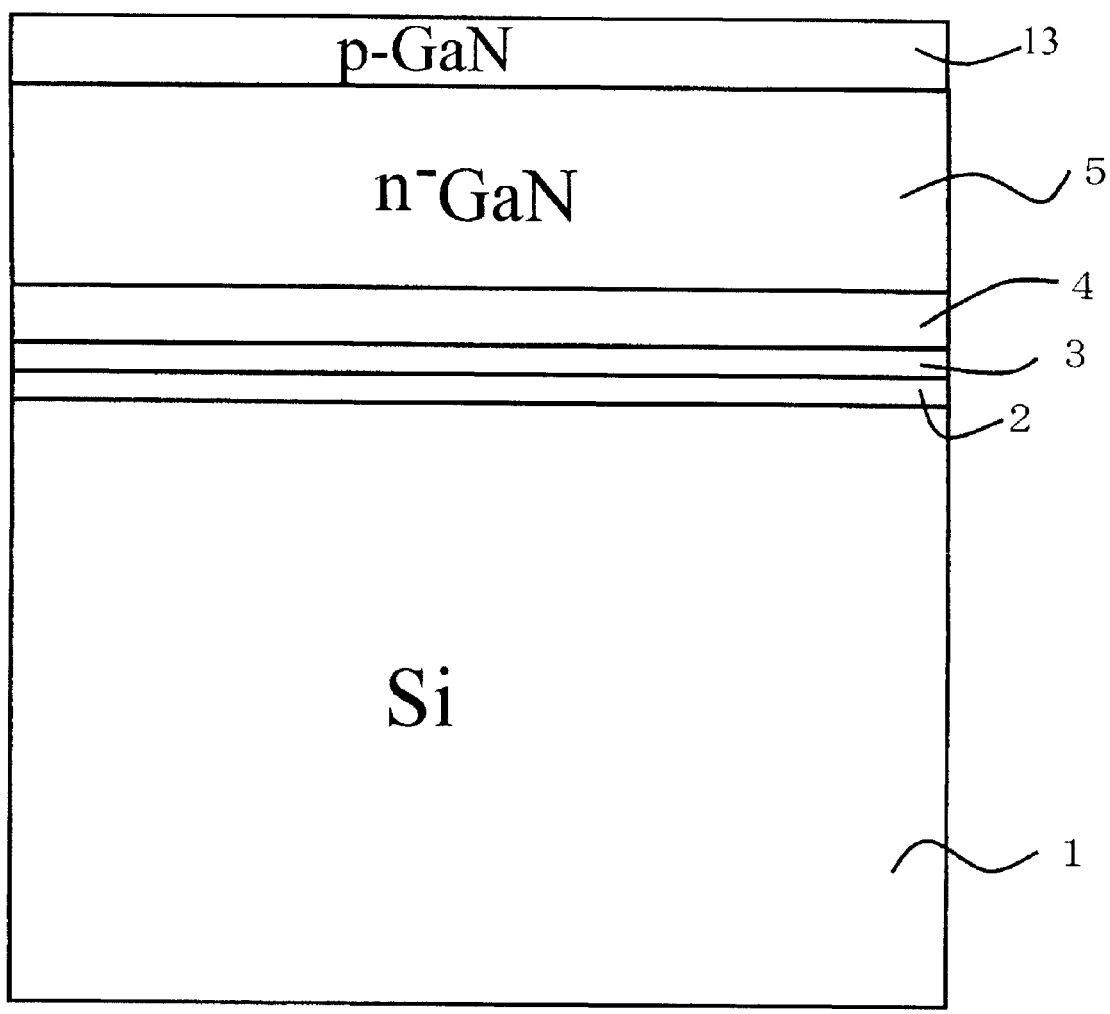
FIG. 2 is a cross sectional view showing an arrangement of the principal part of the GaN-MOSFET according to Example 1 of the invention in the step in which the basic layer structure of the semiconductor substrate is completed in the manufacturing process of the MOSFET.

In the next, the manufacturing method of the gallium nitride MOSFET will be explained by using FIG. 2 and FIG. 3. First, for silicon substrate 1, a substrate whose principal surface is a (111) plane is prepared. On the substrate, AlN layer 2 and non-doped GaN layer 3 are formed by using metal organic chemical vapor deposition (MOCVD) as a known technology. The reason to select the (111) plane of silicon is that the lattice constant of the (111) plane of silicon is 0.3840 nm which is a relatively close value to the value of 0.3819 nm for the GaN surface. For silicon substrate 1, a substrate with a diameter of 200 mm and a thickness of 500 μm was used. The thicknesses of AlN layer 2 and non-doped GaN layer 3 formed on silicon substrate 1 were taken as 15 nm and 200 nm, respectively. AlN layer 2 is formed for crystal structure conversion and non-doped GaN layer 3 is formed as a layer for improving the quality of the crystal. Further thereon, n$^+$ GaN layer 4 with a high impurity concentration and n$^-$ GaN layer 5 with a low impurity concentration are epitaxially grown to thicknesses of 3 μm and 6 μm, respectively. The impurity concentrations of layers 4 and 5 are 5×10$^{19}$ cm$^{-3}$ and 2×10$^{16}$ cm$^{-3}$, respectively. Trimethyl gallium and ammonia gas were used as the gallium material and nitrogen material, respectively, for epitaxial growth of the layers. Moreover, for providing n$^-$ type conductivity, monosilane was used as the dopant.

Furthermore, on n$^-$ GaN layer 5, p$^-$ GaN layer 13 with low impurity concentration was epitaxially grown to a thickness of 2 μm. Its impurity concentration was determined to be 2×10$^{17}$ cm$^{-3}$ with magnesium used for the dopant. With the process steps up to this, the basic layer structure of the semiconductor substrate was completed as shown in the cross sectional view of FIG. 2.

Figure 3:
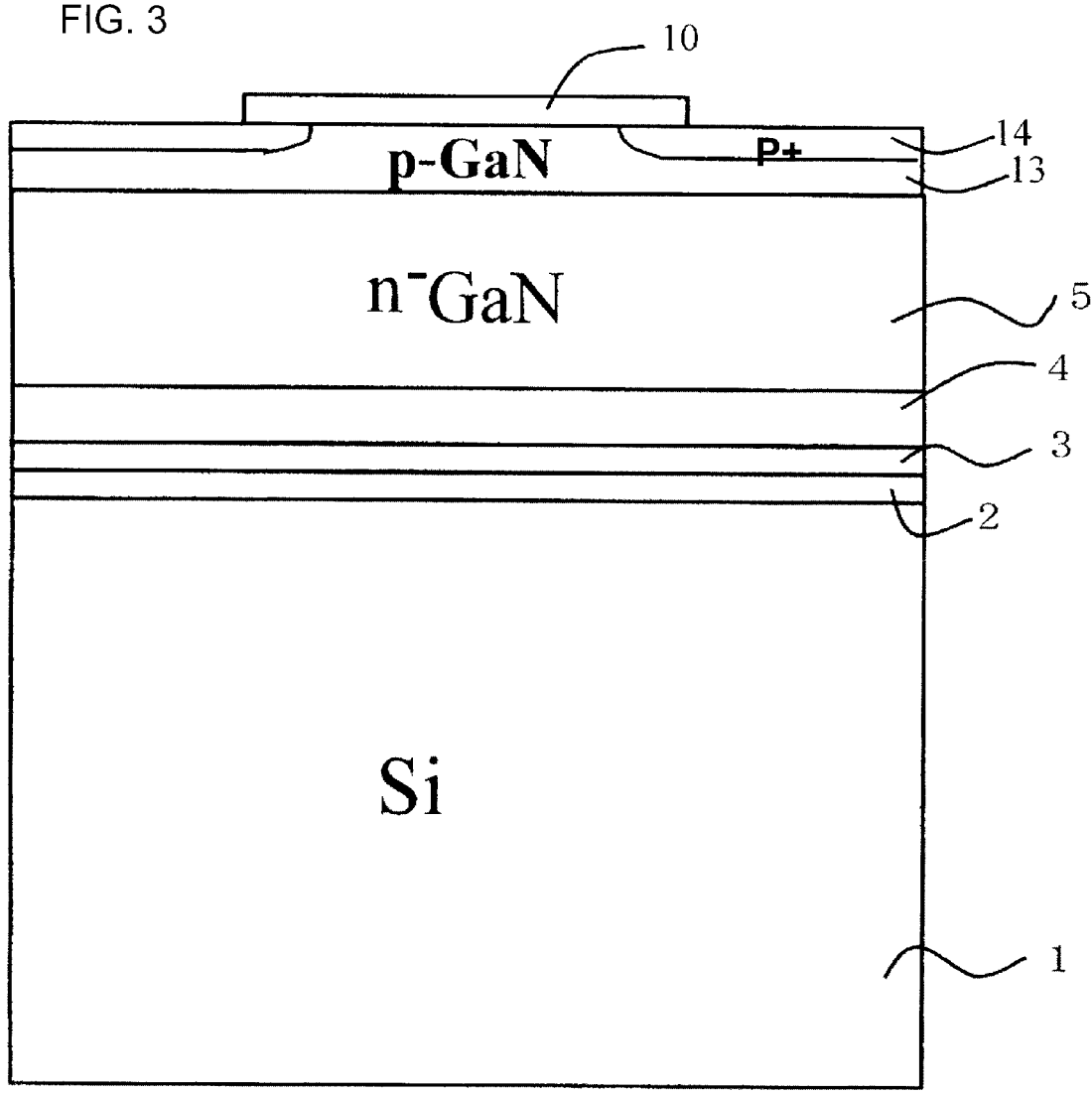
FIG. 3 is a cross sectional view showing an arrangement of the principal part of the GaN-MOSFET according to Example 1 of the invention in the step next to that shown in FIG. 2 in which a p$^+$ layer with a high impurity concentration is formed on the p$^-$ GaN layer in the manufacturing process of the MOSFET.
Figure 4:
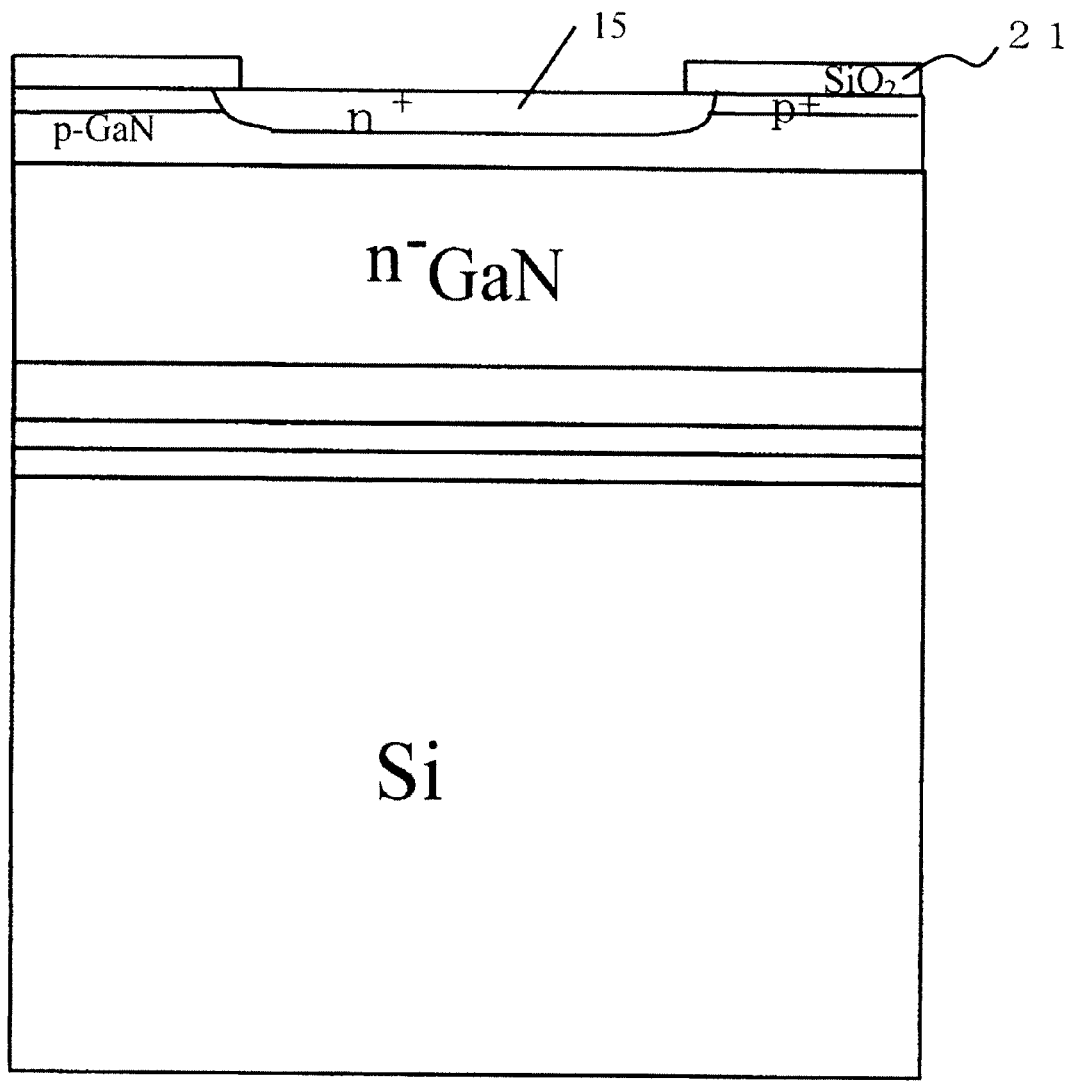
FIG. 4 is a cross sectional view showing an arrangement of the principal part of the GaN-MOSFET according to Example 1 of the invention in the step next to that shown in FIG. 3 in which an n$^+$ source layer with a high impurity concentration is formed on the p$^-$ GaN layer in the manufacturing process of the MOSFET.

Then, as shown in the cross sectional view of FIG. 3, silicon oxide (SiO$_2$) film 10 is formed on the surface of p$^-$ GaN layer 13. After silicon oxide film 10 is subjected to patterning, p$^+$ layer 14 with a high impurity concentration is formed. The p$^+$ layer 14 with a high impurity concentration is formed by ion implantation of magnesium ions with an acceleration voltage of 45 keV so that its impurity concentration becomes $3 \times 10^{18}$ cm$^{-3}$. Thereafter, as shown in the cross sectional view of FIG. 4, silicon oxide (SiO$_2$) film 10 is removed before silicon oxide (SiO$_2$) film 21 is selectively formed again for forming n$^+$ source layer 15 with a high impurity concentration. N$^+$ source layer 15 was formed by ion implantation with silicon ions and aluminum ions taken as impurities. The impurity concentration at that time was $3 \times 10^{18}$ cm$^{-3}$.

Figure 5:
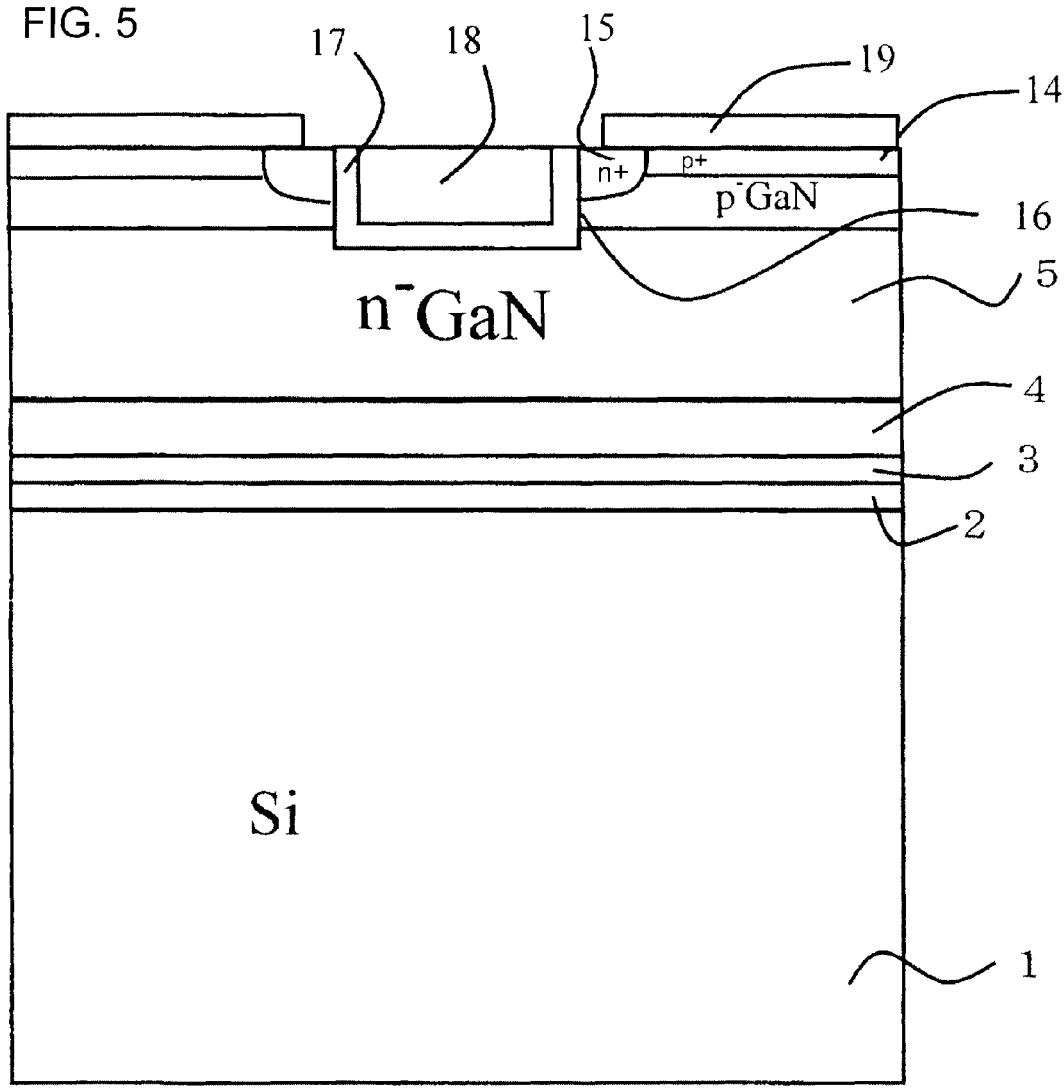
FIG. 5 is a cross sectional view showing an arrangement of the principal part of the GaN-MOSFET according to Example 1 of the invention in the step next to that shown in FIG. 4 in which a gate electrode and a source electrode are formed in the manufacturing process of the MOSFET.
Figure 6:
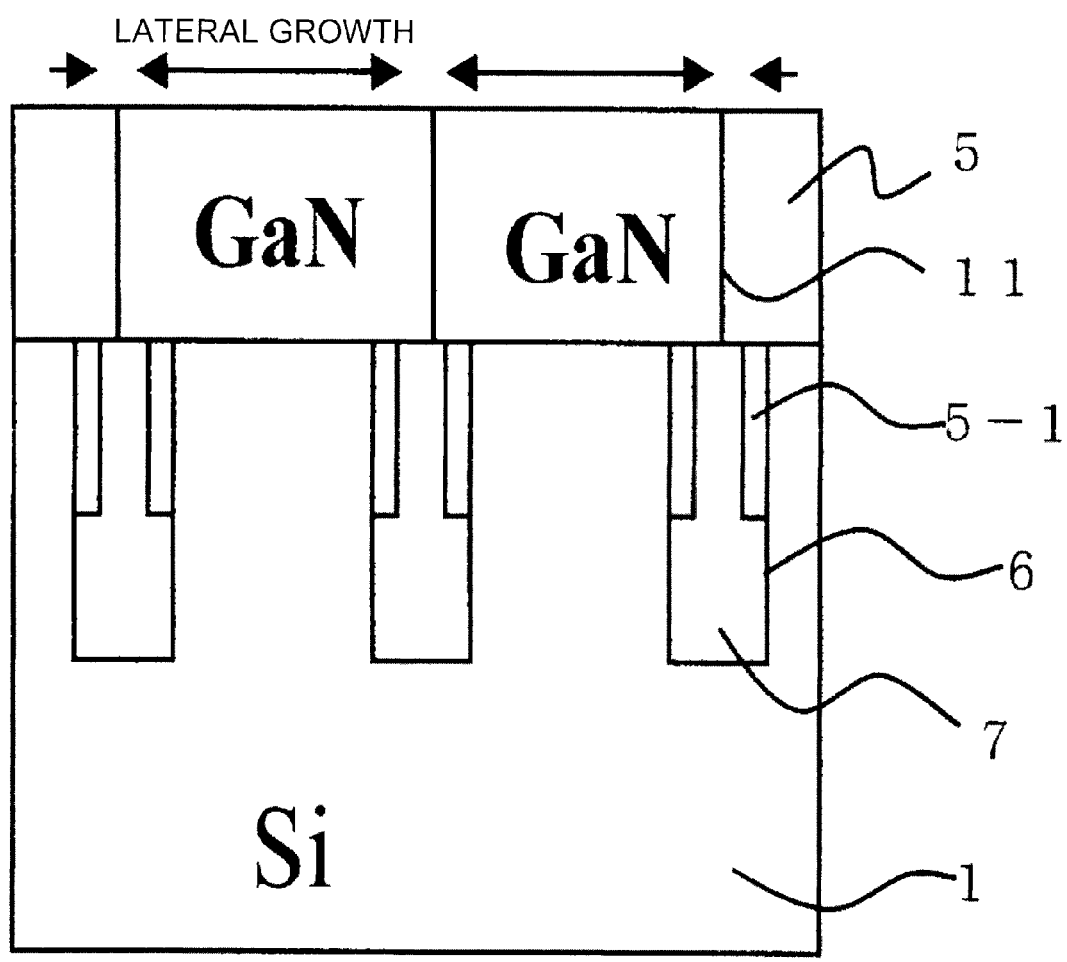
FIG. 6 is a cross sectional view showing the principal part of a related silicon semiconductor substrate with GaN layers formed thereon which substrate is disclosed in JP-A-2006-165191.

After this, as shown in FIG. 5, trench 16 with a depth of 3 μm is formed from the surface of n$^+$ source layer 15 before gate oxide film 17 is formed with a thickness of 100 nm. Then, highly doped low resistance polysilicon was buried in trench 16 to be formed as gate electrode 18. Moreover, for source electrode 19, a titanium/aluminum film is formed to cover the surface of n$^+$ source layer 15 and the surface of p$^+$ layer 14 so as to make ohmic contact commonly with the surfaces.

In the next, the 500 μm thick silicon substrate 1 is subjected to back-grinding from the bottom surface to have a total thickness of 80 μm. Silicon substrate 1 used in Example 1, having a thickness on the order of 500 μm, is subjected to the back-grinding as explained above to reduce the burden of carrying out subsequent trench etching. The back-grinding process, however, can be omitted when the possibility of causing wafer breakage can be eliminated to allow a thin substrate to be used from the beginning for silicon substrate 1. Thereafter, on the bottom surface of silicon substrate 1, an oxide film with a thickness of 1.6 μm is grown, which is subjected to photolithography and etching to form oxide film masks spaced 6 μm apart each with a 6 μm width. Then, by carrying out RIE (Reactive Ion Etching), trenches 12 are formed which penetrate silicon substrate 1 and the buffer layers of AlN layer 2/GaN layer 3 to reach n$^+$ GaN layer 4. As a result, at the bottom of each of trenches 12, n$^+$ GaN layer 4 with a high impurity concentration is exposed. Next to this, metal films of Ti/Ni/Au are formed in lamination for drain electrode 8 so as to cover the bottom and the side wall of each trench 12 and the whole bottom surface of silicon substrate 1. This completes the vertical GaN MOSFET according to Example 1 which is shown in the cross sectional view of FIG. 1. The shape of the opening of each of trenches 12 can be stripe-like, lattice-like, polygonal or circular. In Example 1, the metal films of Ti/Ni/Au for drain electrode 8 were formed by vapor evaporation. The metal films, however, can be formed by sputtering or plating.

In the gallium nitride MOSFET explained as Example 1, there is no fear at all of causing the problem of electrical short-circuit which is due to formation of the grain boundaries as was explained above with respect to JP-A-2006-165191. Moreover, the measurement of the electrical characteristics of the gallium nitride MOSFET according to Example 1 of the invention presented that the breakdown voltage was 670 V as shown in the diagram in FIG. 7 showing the breakdown voltage blocking characteristic at turning-off of the MOSFET. Thus, it is known that the MOSFET exhibits a sufficient blocking characteristic and a sufficient on-voltage characteristic as a semiconductor device with a 600 V breakdown voltage. The chip size and the rated current of the semiconductor device used in the measurement were taken as 5 mm×5 mm and 50 A (the active area=0.2 cm$^2$ and the current density=250.0 A/cm$^2$). In FIG. 8, in addition to the I-V characteristic at turning-on of the GaN-MOSFET according to Example 1 of the invention, the I-V characteristic at turning-on of an ordinary 600 V/50 A silicon IGBT and that of an ordinary 600 V/50 A silicon MOSFET are also shown for comparison (the active area=0.2 cm$^2$ and the current density=250.0 A/cm$^2$ for each). In the gallium nitride MOSFET according to Example 1 of the invention, an on-voltage of 0.45 V is obtained to the rated current of 50 A. The on-voltage is sufficiently lower than those of the silicon IGBT and the silicon MOSFET. From the I-V characteristic at turning-on shown in FIG. 8, it is known that, even though a current two times or more the rated current (100 A) flows, there is no large increase in resistance. This demonstrates that the gallium nitride MOSFET according to Example 1 of the invention exhibits a characteristic better than those of the vertical IGBT of silicon and the MOSFET of silicon so that it sufficiently functions as a vertical device. Furthermore, measurements of turn-off characteristics show that the gallium nitride MOSFET according to Example 1 of the invention has a turning-off time approximately one-sixth compared with that of the silicon IGBT as shown in Table 1 for a low loss and a high speed operation.

TABLE 1

| | DEVICE BREAKDOWN VOLTAGE (V) | LEAK CURRENT (nA) (at Vds = 500 V) | ON-VOLTAGE (V) | TURNING-OFF TIME (nsec) |
|---|---|---|---|---|
| GaN-MOSFET in EXAMPLE 1 | 670 | 135 | 0.45 | 20 |
| Si-IGBT | 680 | 210 | 1.42 | 120 |
| Si-MOSFET | 668 | 140 | >2.50 | 21 |

Example 2

A gallium nitride MOSFET according to Example 2 of the invention has a structure in which, between the buffer layers of AlN layer 2/GaN layer 3 and silicon substrate 1 of the gallium nitride MOSFET shown in FIG. 1 explained as Example 1, metal sulfide layer 22 is further provided as a buffer layer as shown in FIG. 9. According to JP-A-2002-3297, it is disclosed that the use of a metal sulfide thin film as a buffer layer enables epitaxial growth of a sulfide layer without forming an amorphous layer at the interface between the buffer layer and silicon. In Example 1, AlN layer 2/GaN layer 3 were formed directly on silicon substrate 1 as the buffer layers. However, metal sulfide layer 22 additionally formed between the layers of AlN layer 2/GaN layer 3 and silicon substrate 1 enables the layers of AlN layer 2/GaN layer 3 to be obtained with an even higher quality. As a result, the GaN layer formed on the buffer layers of AlN layer 2/GaN layer 3 has an even higher quality. Thus, as metal sulfide layer 22, a MnS thin film with a thickness of 20 nm was formed on silicon substrate 1 with the subsequent manufacturing processes made to be the same as those in the MOSFET according to Example 1, by which a gallium nitride MOSFET according to Example 2 of the invention was made, which has the same structure as that of the MOSFET according to Example 1 except for metal sulfide layer 22. The electrical characteristics of this MOSFET were measured and compared with those of an ordinary silicon IGBT and those of an ordinary silicon MOSFET.

As a result, the I-V characteristic, the turning-off time and the breakdown voltage characteristic of the gallium nitride MOSFET according to Example 2 were completely the same as those of the MOSFET according to Example 1 except for the leak current as shown in Table 2. However, the value of the leak current of the gallium nitride MOSFET according to Example 2 at a high voltage application was largely reduced to one-half of that of the MOSFET according to Example 1 and to one-third of those of an ordinary silicon IGBT and of an ordinary silicon MOSFET, showing that metal sulfite layer 22 has an excellent effect.

TABLE 2

|  | DEVICE BREAKDOWN VOLTAGE (V) | LEAK CURRENT (nA) (at Vds = 500 V) | ON-VOLTAGE (V) | TURNING-OFF TIME (nsec) |
| --- | --- | --- | --- | --- |
| GaN-MOSFET in EXAMPLE 2 | 670 | 65 | 0.45 | 20 |
| Si-IGBT | 680 | 210 | 1.42 | 120 |
| Si-MOSFET | 668 | 140 | >2.50 | 21 |

This is considered to be due to the structure of the buffer layers which include three layers of MnS layer 22/AlN layer 2/GaN layer 3 to improve the crystal qualities in n⁺ GaN layer 4 and n⁻ GaN layer 5 formed on the buffer layers. Moreover, similar experiments carried out with the MnS layer substituted by each of a ZnS layer, a CdS layer and a MgS layer as the metal sulfide layer (with a thickness of 20 nm) also have shown the effect of reducing a leak current to one-third as compared with that in a silicon semiconductor with the same rated breakdown voltage and the same rated current.

Furthermore, in Example 2, because of the approximation of the lattice constant of the silicon substrate to that of the GaN layer, the (111) plane of silicon was selected as the surface of the silicon substrate for forming AlN layer 2/GaN layer 3 thereon. While, similar experiments to those above were carried out each by using a silicon substrate whose surface was the (100) plane with a metal sulfite layer of each of Mn, Cd, Mg and Zn formed between silicon substrate 1 and AlN layer 2/GaN layer 3. When a MnS layer was formed, for example, a leak current of 70 nA was measured which was hardly different from the leak current when the surface of the silicon substrate was the (111) plane. When the other metals were used for the metal sulfide layers, approximately the same leak currents of the order of 70 nA were obtained, demonstrating that an excellent electrical characteristic as a vertical MOSFET can be obtained without dependence on the direction of crystal plane of the silicon substrate.

Example 3

In Example 3 of the invention, manufacture of a Schottky barrier diode which has a breakdown voltage of 600 V will be explained as a vertical semiconductor device. FIG. 10 is a cross sectional view showing the principal part of a gallium nitride Schottky barrier diode according to Example 3 of the invention. As shown in the figure, the gallium nitride Schottky barrier diode according to Example 3 has silicon substrate 1 and the buffer layers of MnS layer 22/AlN layer 2/GaN layer 3, on which n⁺ GaN layer 4 with a high impurity concentration and n⁻ GaN layer 5 with a low impurity concentration are layered by epitaxial growth. Furthermore, silicon substrate 1 has trenches 12 reaching n⁺ GaN layer 4 from the bottom surface of substrate 1. A metal film is then provided so as to cover the bottom and the side wall of each of trenches 12 and the whole bottom surface of silicon substrate 1, by which cathode electrode 20 is formed. Moreover, on the surface of n⁻ GaN layer 5, Schottky barrier electrode film 9 to be an anode electrode is formed.

First, for silicon substrate 1, a substrate whose principal surface is a (111) plane is prepared. On substrate 1, a MnS thin film is formed before AlN layer 2 and non-doped GaN layer 3 are formed thereon, by using metal organic chemical vapor deposition (MOCVD) as a known technology as in Examples 1 and 2. As in Examples 1 and 2, for the surface of silicon substrate 1, the (111) plane of silicon was selected. However, as in Example 2, a substrate whose surface is the (100) plane of silicon can be used. Silicon substrate 1, as in Example 1, has a diameter of 200 nm and a thickness of 500 µm. On substrate 1, MnS layer 22 is formed to a thickness of 20 nm before AlN layer 2 and non-doped GaN layer 3 are formed to thicknesses of 15 nm and 200 nm, respectively. AlN layer 2 is a layer for crystal structure conversion and non-doped GaN layer 3 is a layer for improving the quality of the crystal. N⁺ GaN layer 4 and n⁻ GaN layer 5 are epitaxially grown to thicknesses of 3 µm and 6 µm, respectively. The impurity concentrations of layers 4 and 5 were taken as $5 \times 10^{19}$ cm⁻³ and $2 \times 10^{16}$ cm⁻³, respectively.

Subsequent to this, on the surface of n⁻ GaN layer 5, Schottky barrier electrode film 9 is formed. Schottky barrier electrode film 9 was formed with Ni films and Al films laminated by vacuum evaporation. At this time, it is preferable that silicon oxide film 10 is formed by CVD and patterned before Schottky barrier electrode film 9 is provided by vacuum evaporation. This makes Schottky barrier electrode film 9 on silicon oxide film 10 serve as a field plate, by which a stable breakdown voltage blocking characteristic is obtained. Following this, as in Example 1, silicon substrate 1 with a thickness of 500 µm is subjected to back-grinding from the bottom surface to have a total thickness of 80 µm. Thereafter, on the bottom surface of silicon substrate 1, an oxide film with a thickness of 1.6 µm is grown, which is subjected to photolithography to be formed into oxide film masks. Then, by carrying out etching, trenches 12 are formed which penetrate silicon substrate 1 and the buffer layers of MnS layer 22/AlN layer 2/GaN layer 3. Next, metal films of Ti/Ni/Au are formed in lamination for cathode electrode 20 so as to cover the bottom of each trench 12 which has been exposed as a result of the etching, the side wall of each trench 12 and the whole bottom surface of silicon substrate 1. This completes the vertical GaN Schottky barrier diode according to Example 3, which is shown in the cross sectional view of FIG. 10.

The reverse breakdown voltage blocking characteristic and the forward I-V characteristic of the GaN Schottky barrier diode according to Example 3 are shown in FIG. 11 and FIG. 12, respectively. It is known that, according to FIG. 11, a high breakdown voltage of 710 V is obtained which is not inferior to that of an ordinary silicon pin diode, and according to FIG. 12, an on-voltage (forward voltage drop) is obtained which is equivalent to that of an ordinary pin silicon diode.

Furthermore, the other electrical characteristics of the GaN Schottky barrier diode according to Example 3 and those of the ordinary pin diode of silicon were measured, which characteristics are shown in Table 3. According to Table 3, the GaN Schottky barrier diode according to Example 3 has a leak current reduced to approximately one-sixth as compared to that of the ordinary pin diode of silicon. Moreover, the reverse recovery loss of the GaN Schottky barrier diode according to Example 3 is reduced to one-tenth or less. This demonstrates that the GaN Schottky barrier diode according to Example 3 can be operated with a low loss and a high speed.

TABLE 3

| | DEVICE BREAKDOWN VOLTAGE (V) | LEAK CURRENT (nA) (at Vds = 500 V) | ON-VOLTAGE (V)/100 A | REVERSE RECOVERY LOSS (mJ) |
|---|---|---|---|---|
| GaN SCHOTTKY DIODE in EXAMPLE 3 | 710 | 60 | 1.60 | 0.40 |
| Si-pin DIODE | 714 | 190 | 1.56 | 4.42 |

According to Examples 1, 2 and 3, as explained in the foregoing, a high breakdown voltage vertical gallium nitride semiconductor device can be easily obtained which has a large current characteristic and low on-resistance characteristic better than those of an existing vertical semiconductor device of silicon and is excellent in a high speed operation. Moreover, although the devices in Examples 1, 2 and 3 are n MOSFETS, even when the devices are converted to p MOSFETs by substituting the conductivity type of each layers by the opposite one, it was shown that similar excellent characteristics can be obtained.

While the present invention has been particularly shown and described with reference to preferred embodiments thereof, it will be understood by those skilled in the art that the foregoing and other changes in form and details can be made therein without departing from the spirit and scope of the present invention.

Thus, a gallium nitride semiconductor device and its method of manufacture have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

This application is based on and claims priority to Japanese Patent Application JP 2007-257398, filed on Oct. 1, 2007. The disclosure of the priority application in its entirety, including the drawings, claims, and the specification thereof, is incorporated herein by reference.

What is claimed is:

1. A gallium nitride semiconductor device comprising:
a silicon semiconductor substrate;
a buffer layer provided on a first surface of the silicon semiconductor substrate for crystal structure conversion and/or crystal quality improvement, the buffer layer comprising an aluminum nitride layer on the side of the silicon semiconductor substrate and a gallium nitride layer on the upper side thereof; and
an epitaxial gallium nitride semiconductor layer overlying the buffer layer, the silicon semiconductor substrate having a plurality of trenches formed on the side of the substrate opposite the first surface, each trench reaching through the silicon semiconductor substrate and the buffer layer to the epitaxial gallium nitride semiconductor layer, and the inside surface of each of the trenches and the other principal surface of the silicon semiconductor substrate being covered with a metal film wherein the gallium nitride semiconductor device is a vertical semiconductor device in which a first metal film on a first surface and a second metal film on the other principal surface are electrodes for the device.

2. The gallium nitride semiconductor device as claimed in claim 1, wherein a metal sulfide layer is provided between the buffer layer and the silicon semiconductor substrate.

3. The gallium nitride semiconductor device as claimed in claim 1, wherein the epitaxial gallium nitride semiconductor layer further comprises a gallium nitride semiconductor layer of one conductivity type with a high impurity concentration on the side of the buffer layer and a gallium nitride semiconductor layer of the same conductivity type with a low impurity concentration on the upper side thereof.

4. A method of manufacturing a gallium nitride semiconductor device comprising the steps of:
preparing a silicon semiconductor substrate;
forming a buffer layer on a first surface of the silicon semiconductor substrate, the buffer layer providing crystal structure conversion and/or crystal quality improvement;
forming a gallium nitride semiconductor layer on the buffer layer by epitaxial growth;
forming a plurality of trenches in the silicon semiconductor substrate on the other side of the semiconductor substrate, each trench being formed with a depth so that it reaches through the silicon semiconductor substrate and the buffer layer to the gallium nitride semiconductor layer on the first surface; and
forming a metal film so as to cover the inside surface of each of the trenches and the other principal surface of the silicon semiconductor substrate.

5. The method of manufacturing a gallium nitride semiconductor device as claimed in claim 4, wherein the step of forming the buffer layer further comprises the steps of:
forming an aluminum nitride layer on the side of the silicon semiconductor substrate; and
forming a gallium nitride layer on the upper side the aluminum nitride layer.

* * * * *